United States Patent [19]
Jones et al.

[11] Patent Number: 5,475,329
[45] Date of Patent: Dec. 12, 1995

[54] TURN-OFF CIRCUIT TO PROVIDE A DISCHARGE PATH FROM A FIRST NODE TO A SECOND NODE

[75] Inventors: Steven C. Jones, Garland; Wayne T. Chen, Plano, both of Tex.

[73] Assignee: Texas Instruments Incorporated, Dallas, Tex.

[21] Appl. No.: 176,815

[22] Filed: Jan. 4, 1994

[51] Int. Cl.$^6$ ............................ H03K 17/04; H03K 5/08; H03K 3/00

[52] U.S. Cl. .......................... 327/377; 327/389; 327/309; 327/108; 327/110

[58] Field of Search ..................................... 327/309, 310, 327/313, 314, 321, 108, 180, 110, 194, 377, 427, 379, 389

[56] References Cited

U.S. PATENT DOCUMENTS

| | | | |
|---|---|---|---|
| 4,375,074 | 2/1983 | Glogolja | 327/379 |
| 4,549,095 | 10/1985 | Stefani et al. | 327/377 |
| 4,553,082 | 11/1985 | Nesler | 327/309 |
| 4,677,324 | 6/1987 | Ronan, Jr. et al. | 327/377 |
| 5,313,109 | 5/1994 | Smith | 327/377 |

*Primary Examiner*—Timothy P. Callahan
*Assistant Examiner*—Trong Phang
*Attorney, Agent, or Firm*—W. Daniel Swayze, Jr.; W. James Brady, III; Richard L. Donaldson

[57] ABSTRACT

A turn-off circuit is disclosed that includes a turn-off device (14) having a first current path connected to a first node, a second current path connected to a second node and an input. A control circuit (16) has an output connected to the input of the turn-off device (14) and has an input. A hold-off device (18) has an output connected to the first node and an input. Together, the turn-off device (14), the control circuit (16) and the hold-off device (18) comprise a turn-off circuit (20). A control signal CONTROL 2 is connected to the input of the control circuit (16), and a control signal CONTROL 3 is connected to the input of the hold-off device (18).

18 Claims, 2 Drawing Sheets

TURN-OFF CIRCUIT TO PROVIDE A DISCHARGE PATH FROM A FIRST NODE TO A SECOND NODE

TECHNICAL FIELD OF THE INVENTION

This invention relates in general to the field of electronic circuits and more particularly to an improved turn-off circuit.

BACKGROUND OF THE INVENTION

Semiconductor devices such as field effect transistors and bipolar transistors are often used as elements in electronic circuits. As switches, these devices are useful for electronically driving a load such as an inductor. For example, an n-channel field effect transistor can be used as a high side driver to drive an inductive load. The n-channel field effect transistor acts as a switch between a power supply and the inductive load. When turned on, the n-channel field effect transistor will allow the inductive load to be fluxed. When turned off, the n-channel field effect transistor separates the load from the power supply and allows the inductive load to deflux. In many instances, the inductive load forms a portion of an integrated system that relies on the fast fluxing and defluxing of the inductive load for efficient operation of the system.

SUMMARY OF THE INVENTION

A need has arisen for a turn-off circuit to turn off an n-channel field effect transistor. In accordance with the present invention, a turn-off circuit is provided that substantially eliminates or reduces disadvantages and problems associated with prior circuits used to turn-off n-channel field effect transistors.

According to one embodiment of the present invention, a turn-off circuit is provided that comprises a turn-off device coupled to a first node having a first voltage level and to a second node, the turn-off device operable to provide a discharge path from the first node to the second node. A control circuit is coupled to the turn-off device, the control circuit operable to activate and to deactivate the turn-off device. A first control signal coupled to the control circuit is operable to cause the control circuit to activate and deactivate the turn-off device. A hold-off device coupled to the first node is operable to generate a substantially constant voltage level and to clamp the first voltage level of the first node to the constant voltage level of the hold-off device when the first voltage level of the first node rises above the constant voltage level of the hold-off device. A second control signal coupled to the hold-off device is operable to activate and deactivate the hold-off device.

BRIEF DESCRIPTION OF THE DRAWINGS

A more complete understanding of the present invention and the advantages thereof may be acquired by referring to the following description taken in conjunction with the accompanying drawings in which like reference numbers indicate like features and wherein.

DETAILED DESCRIPTION OF THE INVENTION

Figure 1:
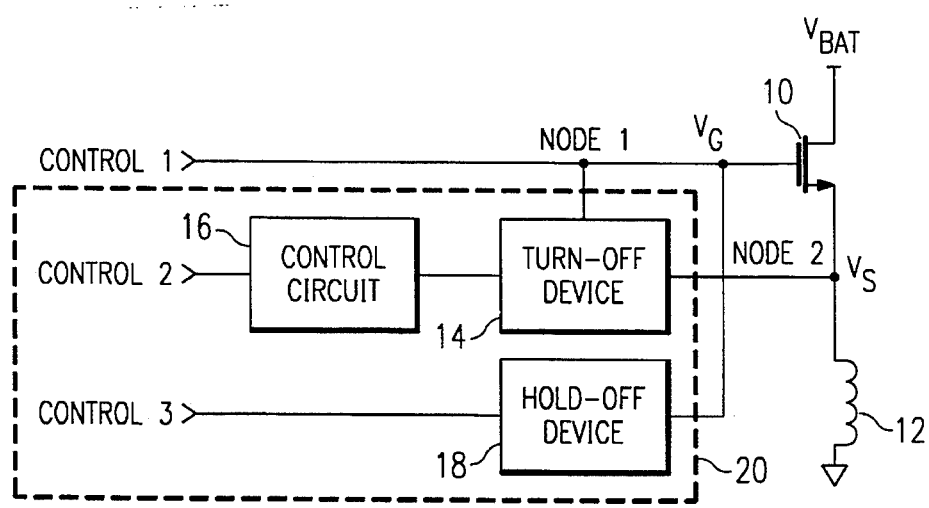
FIG. 1 illustrates one embodiment of a turn-off circuit constructed according to the teachings of the present invention.

The circuit of the present invention operates to turn off an n-channel field effect transistor by providing a discharge path from its gate to its source. In a high side driver circuit, this allows the circuit to deflux an inductive load by quickly snubbing the energy out of the inductive load. Referring to FIG. 1, an n-channel field effect transistor (N-FET) 10 has its drain coupled to a voltage supply $V_{BAT}$, its gate coupled to a NODE 1, and its source coupled to a NODE 2. An inductive load 12 is coupled between NODE 2 and ground potential. A turn-off device 14 comprises a first current path coupled to NODE 1, a second current path coupled to NODE 2 and an input coupled to an output of control circuit 16. The control circuit 16 comprises an input and an output. The output of control circuit 16 is coupled to the input of the turn-off device 14. A hold-off device 18 comprises an input and an output. The output of hold-off device 18 is coupled to NODE 1. A control signal CONTROL 1 is coupled to NODE 1. A control signal CONTROL 2 is coupled to the input of the control circuit 16, and a control signal CONTROL 3 is coupled to the input of the hold-off device 18. The turn-off device 14, the control circuit 16, and the hold-off device 18 together comprise a turn-off circuit 20 constructed according to the teachings of the present invention.

In operation, current passing through the N-FET 10 operates to flux and deflux the inductive load 12. The inductive load 12 is fluxed when current is allowed to flow through the inductive load 12 producing and supporting a magnetic field in the inductive load 12. The inductive load 12 is defluxed when the current flow through the inductive load 12 is decreased causing the magnetic field to collapse. The turn-off device 14 operates to turn off the N-FET 10. The control circuit 16 operates to activate and deactive the turn-off device 14. The turn-off device 14 allows the voltage levels of NODE 1 and NODE 2 to drop beneath ground without triggering parasitics in the turn-off device 14 which would clamp NODE 1 and NODE 2 if triggered.

When the inductive load 12 is fluxed, the CONTROL 1 signal holds the voltage of NODE 1 at a positive voltage slightly higher than $V_{BAT}$. In this state, the N-FET 10 is operating in its linear region, and the voltage, $V_S$, at the source of the N-FET 10, or NODE 2, is approximately equal to $V_{BAT}$ except for the voltage drop across the drain to source resistance of the N-FET 10. Thus, the inductive load 12 has a voltage potential across it of approximately $V_{BAT}$ and is fluxed.

To deflux the inductive load 12, the CONTROL 1 signal is set to a high impedance as sensed by NODE 1, and the CONTROL 2 signal is set to signal the control circuit 16 to activate the turn-off device 14. When the control circuit 16 activates the turn-off device 14, the turn-off device 14 provides a discharge path from NODE 1 to NODE 2. This discharge of NODE 1 turns off the N-FET 10 as the voltage across its gate and source drops to a level that is too small to allow the N-FET 10 to conduct the same level of current from its drain to its source. Thus, the current flowing through the inductive load 12 is no longer supported. The inductive load 12 resists a change in the current flowing through the inductive load 12 resulting in an inductive kick.

The inductive kick causes $V_S$ of NODE 2 to be driven sharply negative as the inductive load 12 tries to support its magnetic field by maintaining the amount of current flowing through the inductive load 12. As $V_S$ drops negative, the turn-off device continues to provide a discharge path from NODE 1 to NODE 2 keeping the N-FET 10 turned off. The voltage levels of NODE 1 and NODE 2 drop negative together because of the AC coupling between NODE 1 and NODE 2. The energy in the inductive load 12 is defluxed as the energy is quickly snubbed out of the inductive load 12. After the inductive load 12 has been defluxed, the voltage levels of NODE 1 and NODE 2 return approximately to ground potential.

Shortly after the CONTROL 2 signal is set to signal the control circuit 16 to activate the turn-off device 14, the CONTROL 3 signal signals the hold-off device 18 to monitor the voltage level of NODE 1. The hold-off device 18 generates a substantially constant voltage level to monitor the voltage level of NODE 1. When the voltage level of NODE 1 returns to ground potential along with the voltage level of NODE 2, the hold-off device 18 ensures that the voltage level of NODE 1 does not rise above the substantially constant voltage level of the hold-off device 18. In this way, the hold-off device 18 operates to hold the N-FET 10 from turning on by preventing the voltage level of NODE 1 from rising to a threshold voltage drop above the voltage level of NODE 2. The hold-off device 18 clamps the voltage level of NODE 1 to the substantially constant voltage level of the hold-off device 18. The turn-off circuit 20 therefore holds the inductive load 12 in an off state with no energy stored within the inductive load 12 until the CONTROL 1 signal again turns on the N-FET 10. The CONTROL 3 signal is turned off prior to the CONTROL 1 signal turning on the N-FET 10 to flux the inductive load 12. The turn-off circuit 20 operates in this way to turn off the N-FET 10 and allow the inductive load 12 to be defluxed.

Figure 2:
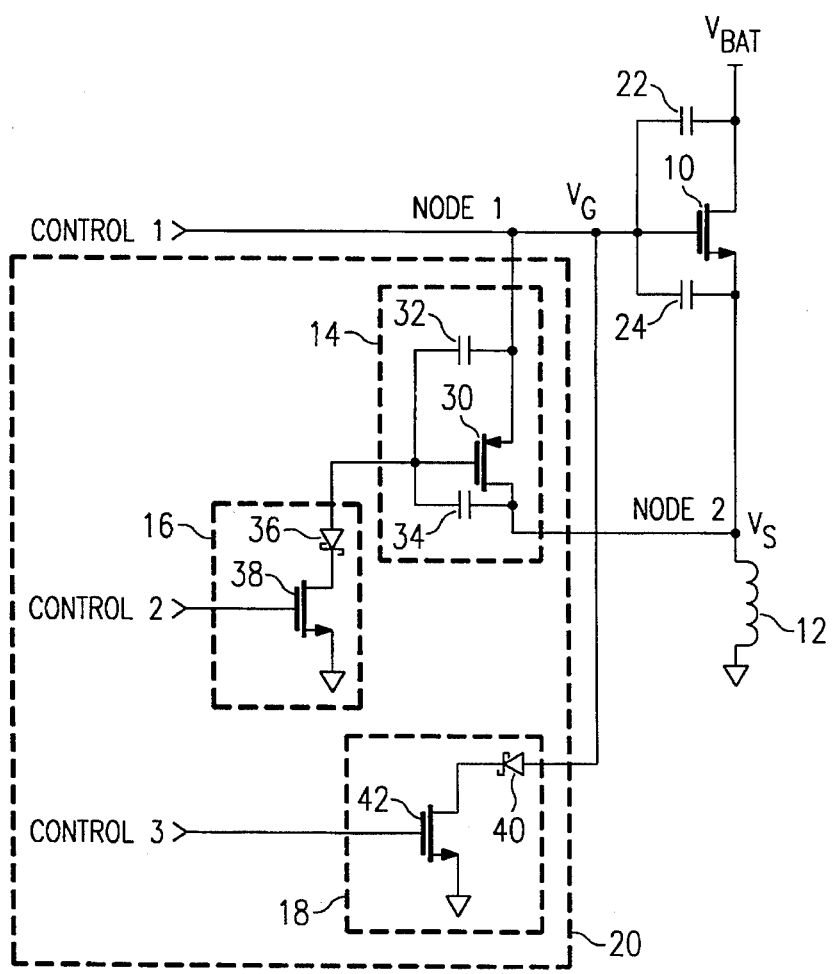
FIG. 2 illustrates another embodiment of a turn-off circuit constructed according to the teachings of the present invention.

FIG. 2 illustrates a particular embodiment of the circuit of the present invention and particularly one specific manner of constructing the turn-off circuit 20 discussed with reference to FIG. 1 previously. Parasitic capacitances associated with the N-FET 10 have been included in FIG. 2 because the effect of these parasitic capacitances will be examined. The N-FET 10 has a parasitic capacitance $C_{GD}$ 22 between its drain and its gate and a parasitic capacitance $C_{GS}$ 24 between its gate and its source. Parasitic capacitances 22 and 24 are not separate elements of the circuit but are parasitics associated with the physical structure of the N-FET 10 itself. The turn-off device 14 comprises a p-channel field effect transistor (P-FET) 30 that has its source coupled to NODE 1, its gate coupled to the control circuit 16 and its drain coupled to NODE 2. The P-FET 30 has a parasitic capacitance $C_{GS}$ 32 coupled between its source and its gate and a parasitic capacitance $C_{GD}$ 34 coupled between its gate and its drain. As with the N-FET 10, the parasitic capacitances 32 and 34 of the P-FET 30 are parasitics associated with the physical structure of the P-FET 30 and not separate circuit elements. The P-FET 30 allows the voltage levels of NODE 1 and NODE 2 to drop beneath ground potential without triggering parasitics in the P-FET 30. The control circuit 16 comprises a Schottky diode 36 that is coupled to the turn-off device 14 and to the drain of an n-channel field effect transistor (N-FET) 38. The N-FET 38 has its gate controlled by a control signal CONTROL 2 and has its source coupled to ground potential. The hold-off device 18 comprises a Schottky diode 40 that is coupled to NODE 1 and to the drain of an n-channel field effect transistor (N-FET) 42. The N-FET 42 has its gate controlled by control signal CONTROL 3 and has its source coupled to ground potential.

The turn-off circuit 20 of FIG. 2 operates to allow the inductive load 12 to be defluxed by quickly snubbing the energy from the inductive load 12. When the inductive load 12 is fluxed, the CONTROL 1 signal supplies NODE 1 with a voltage level higher than $V_{BAT}$. In this state, the N-FET 10 operates in its linear region and the inductive load 12 is fluxed. When it is desired to deflux the inductive load 12, the CONTROL 1 signal becomes a high impedance as sensed by NODE 1, and the turn-off circuit 20 operates to provide a discharge path from NODE 1 to NODE 2. Specifically, the P-FET 30 of the turn-off device 14 operates to provide a discharge path from NODE 1 to NODE 2. When the P-FET 30 is activated and providing a discharge path from the gate to the source of the N-FET 10, the voltage across the gate and the source of the N-FET 10 is reduced by discharging $C_{GS}$ 24. Activation of the P-FET 30 is initiated by conduction of current through the N-FET 38 and through the Schottky diode 36. This conduction is initiated by the CONTROL 2 signal activating the N-FET 38. The conduction of current through the Schottky diode 36 and the N-FET 38 charges $C_{GS}$ 32 and $C_{GD}$ 34 until the voltage between the source and gate of the P-FET 30 is large enough to turn on the P-FET 30.

As the voltage across the gate and source of the P-FET 30 increases to exceed the turn-on voltage, the impedance from the source to the drain of the P-FET 30 decreases. With the decrease in this impedance, $C_{GS}$ 24 of N-FET 10 begins discharging. This, in turn, decreases the voltage across the gate and source of the N-FET 10. The voltage across the gate and source of the N-FET 10 decreases until the N-FET 10 is no longer in the linear region of operation but has entered the saturation region. The voltage across the drain and source of the N-FET 10 rapidly increases as the current from the drain to the source of the N-FET 10 becomes less than the current through the inductive load 12. This causes a changing voltage with respect to time at NODE 2. During this transition, the voltage level of NODE 1, NODE 2, and the gate of the P-FET 30 fall rapidly. These voltages are pulled down by the inductive load kick discussed previously. This kick is caused by the resistance of the inductive load 12 to any change in the amount of current running through it by collapse of the magnetic field defluxing.

Conduction of current through the P-FET 30 provides the current required by $C_{GD}$ 22 to support the change in the voltage on NODE 1. The voltage level of the gate of the P-FET 30 is simultaneously pulled down by the operation of the Schottky diode 36, the P-FET 38 and by the AC coupling through $C_{GD}$ 34 and $C_{GS}$ 32. The AC coupling through $C_{GD}$ 34 and $C_{GS}$ 32 continues to pull the gate of the P-FET 30 negative when the voltage level of the gate of the P-FET 30 reaches a level equivalent to the voltage drop across the N-FET 38 and the Schottky diode 36. This condition reverse biases the Schottky diode 36. In the reverse-biased condition, the Schottky diode 36 operates to block any current flowing from the N-FET 38 to the P-FET 30. In this state, the voltage level $V_G$ of NODE 1, the voltage level of the gate of the P-FET 30 and the voltage level, $V_S$, of NODE 2 remain coupled by the AC characteristics of the parasitic capacitances of the P-FET 30 and the N-FET 10. With $V_S$ negative, the inductive load 12 defluxes, and the energy within load 12 is quickly dissipated. After the inductive load 12 has defluxed, the voltage levels of the gate of P-FET 30, $V_S$, and $V_G$ return to near ground potential.

Shortly after the CONTROL 2 signal activates the N-FET 38, the CONTROL 3 signal activates the N-FET 42. With the N-FET 42 activated, the hold-off device 18 monitors the voltage level, $V_G$, of NODE 1. The hold-off device 18 uses a substantially constant voltage reference equal to ground potential. When $V_G$ of NODE 1 reaches ground potential, the hold-off device 18 ties the voltage level of NODE 1 to ground potential through the Schottky diode 40 and the N-FET 42. In this way, the hold-off device 18 operates to ensure that the N-FET 10 does not turn on and again flux the inductive load 12 until it is desired to do so by raising the voltage of NODE 1 with the CONTROL 1 signal.

Figure 3:
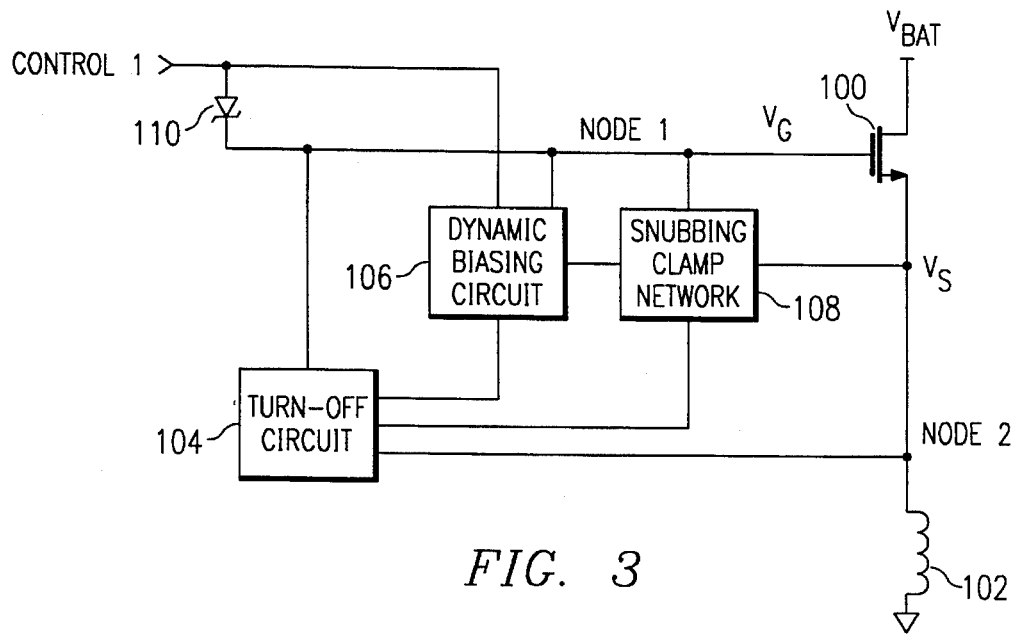
FIG. 3 illustrates an integrated high side driver circuit constructed according to the teachings of the present invention.

FIG. 3 illustrates an integrated high side driver circuit constructed according to the teachings of the present invention. An n-channel field effect transistor (N-FET) 100 has its drain coupled to a power supply voltage, $V_{BAT}$, its gate coupled to a NODE 1, and its source coupled to a NODE 2. The voltage level of NODE 1 is $V_G$, and the voltage level of NODE 2 is $V_S$. An inductive load 102 is coupled to NODE 2 and to ground potential. A control signal CONTROL 1 is coupled to NODE 1 and thus to the gate of the N-FET 100. A turn-off circuit 104 coupled to NODE 1, to NODE 2 and to a dynamic biasing circuit 106 as shown. A snubbing clamp network 108 is coupled to NODE 1, NODE 2, and the dynamic biasing circuit 106 as shown.

In operation, the integrated high side driver circuit operates to drive the inductive load 102. The turn-off circuit 104 operates as described above to provide a discharge path from NODE 1 to NODE 2 and turn off the N-FET 100. One possible embodiment of dynamic biasing circuit 106 is described in application Ser. No. 08/177,811, entitled "DYNAMIC BIASING CIRCUIT" (Texas Instruments Reference No. TI-17749) filed concurrently with the present application on Jan. 4, 1994, the disclosure of which is hereby incorporated by reference into the disclosure of the present application as if fully set forth herein. One possible embodiment of snubbing clamp network 108 is described in application Ser. No. 08/176,816, entitled "SNUBBING CLAMP NETWORK" (Texas Instruments Reference No. TI-17750) filed concurrently herewith on Jan. 4, 1994, the disclosure of which is hereby incorporated by reference into the disclosure of the present application as if fully set forth herein.

Figure 4:
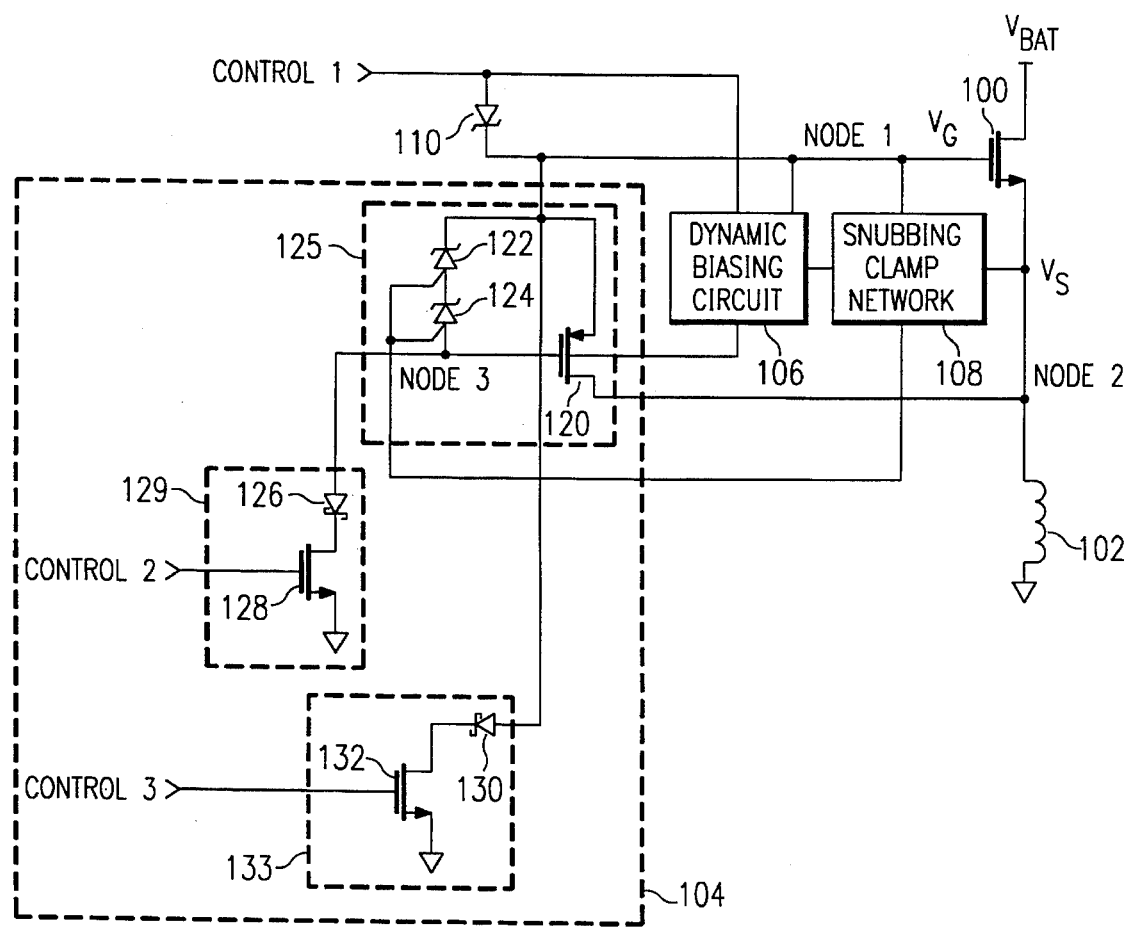
FIG. 4 illustrates another embodiment of an integrated high side driver circuit constructed according to the teachings of the present invention.

FIG. 4 illustrates an integrated high side driver circuit constructed according to the teachings of the present invention. The turn-off circuit 104 of FIG. 4 has a p-channel field effect transistor (P-FET) 120 with its source coupled to NODE 1, its drain coupled to NODE 2 and its gate coupled to NODE 3. A first zener diode 122 has its cathode coupled to NODE 1 and its anode coupled to a second zener diode 124. The second zener diode 124 has its cathode coupled to the anode of the first zener diode 122 and its anode coupled to NODE 3. The P-FET 120, zener diode 122, and zener diode 124 comprise a turn-off device 125. A Schottky diode 126 has its anode coupled to NODE 3 and its cathode coupled to an n-channel field effect transistor (N-FET) 128. The N-FET 128 has its drain coupled to the Schottky diode 126, its gate coupled to CONTROL 2 and its source coupled to ground potential. The Schottky diode 126 and the N-FET 128 comprise a control circuit 129. A Schottky diode 130 has its anode coupled to NODE 1 and to an n-channel field effect transistor (N-FET) 132. The N-FET 132 has its drain coupled to the Schottky diode 130, its gate coupled to CONTROL 3 and its source coupled to ground potential. The Schottky diode 130 and the N-FET 132 comprise a hold-off device 133.

The dynamic biasing circuit 106 and the snubbing clamp network 108 operate as described with reference to the integrated high side driver circuit of FIG. 3. The turn-off circuit 104 of FIG. 4 operates in substantially the same manner as the embodiment of the present invention illustrated in FIG. 2. The differences in the operation of circuit 104 are due to the incorporation of zener diodes 122 and 124 and the backgate biasing of the P-FET 120 by the dynamic biasing circuit. The zener diodes 122 and 124 operate to protect the source-to-gate junction of the P-FET 120. The zener diodes 122 and 124 establish a breakdown voltage that clamps the source-to-gate voltage level of the P-FET 120 to ensure that the level does not become greater than the breakdown voltage of the P-FET 120's source-gate terminals. The backgate biasing of the P-FET 120 by the dynamic biasing circuit 106 ensures that the P-FET 120 does not suffer from undesirable substrate currents. In addition, the zener diodes 122 and 124 are n-well biased by the snubbing clamp network 108. The effect of this n-well biasing is to ensure no activation of parasitic diodes and bipolar transistors within the zener diode structure. N-well biasing of the zener diode structure is described in application Ser. No. 08/176,816, entitled "SNUBBING CLAMP NETWORK" (Texas Instruments reference No. TI-17750) filed concurrently herewith on Jan. 4, 1994. Otherwise, the turn-off circuit 104 of FIG. 4 operates to turn off the power N-FET 100 and allow the inductive load 102 to be defluxed by quickly snubbing the energy out of the inductive load 102. This operation is the same as that discussed above with reference to FIG. 2.

Although the present invention has been described in detail, it should be understood that various changes, substitutions and alterations may be made to the embodiments herein without departing from the spirit and scope of the present invention which is solely defined by the appended claims.

What is claimed is:

1. A turn-off circuit, comprising:

a first node and a second node;

a turn-off device coupled to the first node having a first voltage level and to the second node, the turn-off device operable to provide a discharge path from the first node to the second node;

a control circuit coupled to the turn-off device, the control circuit operable to activate and to deactivate the turn-off device and to input a first control signal to cause the control circuit to activate and deactivate the turn-off device; and a hold-off device coupled to the first node, the hold-off device operable to generate a substantially constant voltage level and to clamp the first voltage level of the first node to the constant voltage level of the hold-off device when the first voltage level of the first node rises above the constant voltage level of the hold-off device and to input a second control signal to activate and deactivate the hold-off device, wherein the turn-off device comprises a p-channel field effect transistor having a source coupled to the first node, a drain coupled to the second node, and a gate coupled to the control circuit, the p-channel field effect transistor operable to provide a discharge path from the first node to the second node.

2. A turn-off circuit, comprising:

a first node and a second node;

a turn-off device coupled to the first node having a first voltage level and to the second node, the turn-off device operable to provide a discharge path from the first node to the second node;

a control circuit coupled to the turn-off device, the control circuit operable to activate and to deactivate the turn-off device and to input a first control signal to cause the control circuit to activate and deactivate the turn-off device; and a hold-off device coupled to the first node, the hold-off device operable to generate a substantially constant voltage level and to clamp the first voltage level of the first node to the constant voltage level of the hold-off device when the first voltage level of the first node rises above the constant voltage level of the hold-off device and to input a second control signal to activate and deactivate the hold-off device, wherein the control circuit comprises:

a diode having an anode and a cathode, the anode being coupled to the turn-off device, the diode operable to block current from flowing to the turn-off device from the control circuit; and a transistor having a first current path coupled to the cathode of the diode and a second current path coupled to ground potential and operable to activate and to deactivate the turn-off device.

3. A turn-off circuit, comprising:

a first node and a second node;

a turn-off device coupled to the first node having a first voltage level and to the second node, the turn-off device operable to provide a discharge path from the first node to the second node;

a control circuit coupled to the turn-off device, the control circuit operable to activate and to deactivate the turn-off device and to input a first control signal to cause the control circuit to activate and deactivate the turn-off device; and a hold-off device coupled to the first node, the hold-off device operable to generate a substantially constant voltage level and to clamp the first voltage level of the first node to the constant voltage level of the hold-off device when the first voltage level of the first node rises above the constant voltage level of the hold-off device and to input a second control signal to activate and deactivate the hold-off device, wherein the control circuit comprises:

a diode having an anode and a cathode, the anode coupled to the turn-off device, the diode operable to block current from flowing to the turn-off device from the control circuit; and an n-channel field effect transistor having a drain coupled to the cathode of the diode, a source coupled to ground potential, and a gate coupled to the first control signal, the n-channel field effect transistor operable to activate and to deactivate the turn-off device.

4. A turn-off circuit, comprising:

a first node and a second node;

a turn-off device coupled to the first node having a first voltage level and to the second node, the turn-off device operable to provide a discharge path from the first node to the second node;

a control circuit coupled to the turn-off device, the control circuit operable to activate and to deactivate the turn-off device and to input a first control signal to cause the control circuit to activate and deactivate the turn-off device; and a hold-off device coupled to the first node, the hold-off device operable to generate a substantially constant voltage level and to clamp the first voltage level of the first node to the constant voltage level of the hold-off device when the first voltage level of the first node rises above the constant voltage level of the hold-off device and to input a second control signal to activate and deactivate the hold-off device, wherein the control circuit comprises:

a Schottky diode having an anode and a cathode, the anode coupled to the turn-off device, the Schottky diode operable to block current from flowing to the turn-off device from the control circuit; and a transistor having a first current path coupled to the cathode of the Schottky diode and having a second current path coupled to ground potential, the transistor operable to activate and to deactivate the turn-off device.

5. A turn-off circuit, comprising:

a first node and a second node;

a turn-off device coupled to the first node having a first voltage level and to the second node, the turn-off device operable to provide a discharge path from the first node to the second node;

a control circuit coupled to the turn-off device, the control circuit operable to activate and to deactivate the turn-off device and to input a first control signal to cause the control circuit to activate and deactivate the turn-off device; and a hold-off device coupled to the first node, the hold-off device operable to generate a substantially constant voltage level and to clamp the first voltage level of the first node to the constant voltage level of the hold-off device when the first voltage level of the first node rises above the constant voltage level of the hold-off device and to input a second control signal to activate and deactivate the hold-off device, wherein the hold-off device comprises:

a diode having an anode coupled to the first node and a cathode, the diode operable to block current from flowing to the first node from the hold-off device; and a transistor having a first current path coupled to the cathode of the diode and a second current path coupled to ground potential, the transistor operable to clamp the voltage level of the first node to ground potential when the voltage level of the first node rises above ground potential.

6. A turn-off circuit, comprising:

a first node and a second node;

a turn-off device coupled to the first node having a first voltage level and to the second node, the turn-off device operable to provide a discharge path from the first node to the second node;

a control circuit coupled to the turn-off device, the control circuit operable to activate and to deactivate the turn-off device and to input a first control signal to cause the control circuit to activate and deactivate the turn-off device; and a hold-off device coupled to the first node, the hold-off device operable to generate a substantially constant voltage level and to clamp the first voltage level of the first node to the constant voltage level of the hold-off device when the first voltage level of the first node rises above the constant voltage level of the hold-off device and to input a second control signal to activate and deactivate the hold-off device, wherein the hold-off device comprises:

a diode having an anode coupled to the first node and a cathode, the diode operable to block electric current from flowing to the first node from the hold-off device; and an n-channel field effect transistor having a drain coupled to the cathode of the diode, a source coupled to ground potential, and a gate coupled to the second control signal, the n-channel field effect transistor operable to clamp the voltage level of the first node to ground potential when the voltage level of the first node rises above ground potential.

7. A turn-off circuit, comprising:

a first node and a second node;

a turn-off device coupled to the first node having a first voltage level and to the second node, the turn-off device operable to provide a discharge path from the first node to the second node;

a control circuit coupled to the turn-off device, the control circuit operable to activate and to deactivate the turn-off device and to input a first control signal to cause the control circuit to activate and deactivate the turn-off device; and a hold-off device coupled to the first node, the hold-off device operable to generate a substantially constant voltage level and to clamp the first voltage level of the first node to the constant voltage level of the hold-off device when the first voltage level of the first node rises above the constant voltage level of the hold-off device and to input a second control signal to activate and deactivate the hold-off device, wherein the hold-off device comprises:

a Schottky diode having an anode coupled to the first node and a cathode, the Schottky diode operable to block electric current from flowing to the first node from the hold-off device; and a transistor having a first current path coupled to the cathode of the Schottky diode and having a second current path coupled to ground potential, the transistor operable to clamp the voltage level of the first node to ground potential when the voltage level of the first node rises above ground potential.

8. A turn-off circuit, comprising:

a first node and a second node;

a first transistor having a first current path coupled to the first node with a first voltage level and having a second current path coupled to the second node, the first transistor operable to provide a discharge path from the first node to the second node;

a control circuit coupled to an input of the first transistor, comprising:

a first diode having a first anode and a first cathode, the first anode coupled to the input of the first transistor and the first diode operable to block current from flowing to the first transistor from the control circuit; and a second transistor having a first current path coupled to the first cathode of the first diode and having a second current path coupled to ground potential and operable to activate the first transistor when the second transistor is activated;

a first control signal coupled to an input of the second transistor of the control circuit and operable to activate and deactivate the second transistor;

a hold-off circuit, comprising:

a second diode having a second anode and a second cathode, the second anode coupled to the first node, the second diode operable to block current from flowing to the first node from the hold-off circuit; and a third transistor having a first current path coupled to the second cathode of the second diode and having a second current path coupled to ground potential and operable to clamp the voltage level of the first node to ground potential when the voltage level of the first node rises above ground potential and the third transistor is turned on; and a second control signal coupled to an input of the third transistor of the hold-off device operable to activate and deactivate the third transistor.

9. The turn-off circuit of claim 8, wherein the first transistor comprises a p-channel field effect transistor having a source coupled to the first node, a drain coupled to the second node, and a gate coupled to the control circuit, the p-channel field effect transistor operable to provide a discharge path from the first node to the second node.

10. The turn-off circuit of claim 8, wherein the first diode comprises a Schottky diode.

11. The turn-off circuit of claim 8, wherein the second transistor comprises an n-channel field effect transistor having a drain coupled to the cathode of the first diode, a source coupled to ground potential and a gate coupled to the first control signal, the n-channel field effect transistor operable to activate the first transistor when the n-channel field effect transistor is activated.

12. The turn-off circuit of claim 8, wherein the second diode comprises a Schottky diode.

13. The turn-off circuit of claim 8, wherein the third transistor comprises an n-channel field effect transistor having a drain coupled to the cathode of the second diode, a source coupled to ground potential, and a gate coupled to the second control signal, the n-channel transistor operable to clamp the voltage level of the first node to ground potential when the voltage level of the first node rises above ground potential and the third transistor is activated.

14. An integrated high-side driver circuit, comprising:

an n-channel power field effect transistor having a drain coupled to a power supply, a gate coupled to a first node having a first voltage level, and a source coupled to a second node having a second voltage level and operable to connect the power supply to the second node;

an inductive load coupled to the second node and to ground potential;

a turn-off circuit coupled to the first node and to the second node operable to provide a discharge path from the first node to the second node;

a snubbing clamp network coupled to the first node, to the second node and to the turn-off circuit, the snubbing clamp network operable to clamp the first voltage level and to clamp the difference between the first voltage level and the second voltage level;

a dynamic biasing circuit coupled to the first node, to a third node, to the turn-off circuit and to the snubbing clamp network, the dynamic biasing circuit operable to provide dynamic biasing to the turn-off circuit and the snubbing clamp network;

a diode having a cathode coupled to the first node and an anode coupled to the third node, the diode operable to allow current to flow from the third node to the first node; and a control signal coupled to the third node and operable to turn on the n-channel power field effect transistor.

15. The integrated high-side driver circuit of claim 14, wherein the turn-off circuit comprises:

a turn-off device coupled to the first node and to the second node operable to provide a discharge path from the first node to the second node;

a control circuit coupled to the turn-off device and operable to activate and to deactivate the turn-off device; and to input a first control signal operable to cause the control circuit to activate and deactivate the turn-off device; and a hold-off device coupled to the first node and operable to generate a substantially constant voltage level and to clamp the voltage level of the first node to the substantially constant voltage level of the hold-off device when the voltage level of the first node rises above the substantially constant voltage level of the hold-off device and to input a second control signal operable to activate and deactivate the hold-off device.

16. The integrated high-side driver circuit of claim 14, wherein the turn-off circuit comprises:

a turn-off device comprising a transistor having a first current path coupled to the first node and having a second current path coupled to the second node, the transistor operable to provide a discharge path from the first node to the second node;

a control circuit coupled to the turn-off device and operable to activate and deactivate the turn-off device and to input a first control signal operable to cause the control circuit to activate and deactivate the turn-off device;

a hold-off device coupled to the first node and operable generate a substantially constant voltage level and to clamp the voltage level of the first node to the substantially constant voltage level of the hold-off device when the voltage level of the first node rises above the substantially constant voltage level of the hold-off device and to input a second control signal operable to activate and deactivate the hold-off device.

17. The integrated high-side driver circuit of claim 14, wherein the turn-off circuit comprises:

a turn-off device coupled to the first node and to the second node and operable to provide a discharge path from the first node to the second node;

a control circuit comprising:

a diode having a first anode and a first cathode, the first anode coupled to the turn-off device and a cathode, the diode operable to block current from flowing to the turn-off device from the control circuit; and a transistor having a first current path coupled to the first cathode of the diode and having a second current path coupled to ground potential and operable to activate and to deactivate the turn-off device and to input a first control signal operable to cause the control circuit to activate and deactivate the turn-off device;

a hold-off device coupled to the first node and operable to generate a substantially constant voltage level and to clamp the voltage level of the first node to the substantially constant voltage level of the hold-off device when the voltage level of the first node rises above the substantially constant voltage level of the hold-off device and to input a second control signal operable to activate and deactivate the hold-off device.

18. The integrated high-side driver circuit of claim 14, wherein the turn-off circuit comprises:

a turn-off device coupled to the first node and to the second node and operable to provide a discharge path from the first node to the second node;

a control circuit coupled to the turn-off device and operable to activate and to deactivate the turn-off device and to input a first control signal operable to cause the control circuit to activate and deactivate the turn-off device;

a hold-off device comprising:

a diode having an anode and a cathode, the anode coupled to the first node and a cathode, the diode operable to block current from flowing to the first node; and a transistor having a first current path coupled to the cathode of the diode and having a second current path coupled to ground potential and operable to clamp the voltage level of the first node to ground potential when the voltage level of the first node rises above ground potential and to input a second control signal operable to activate and deactivate the hold-off device.

\* \* \* \* \*